United States Patent
Cheng et al.

(10) Patent No.: US 9,691,726 B2
(45) Date of Patent: Jun. 27, 2017

(54) METHODS FOR FORMING FAN-OUT PACKAGE STRUCTURE

(71) Applicant: Taiwan Semiconductor Manufacturing Company, Ltd., Hsin-Chu (TW)

(72) Inventors: Ming-Da Cheng, Jhubei (TW); Hsien-Wei Chen, Hsin-Chu (TW); Cheng-Lin Huang, Hsin-Chu (TW); Meng-Tse Chen, Changzhi Township (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/325,810

(22) Filed: Jul. 8, 2014

(65) Prior Publication Data

US 2016/0013147 A1  Jan. 14, 2016

(51) Int. Cl.
*H01L 21/00* (2006.01)
*H01L 23/00* (2006.01)
(Continued)

(52) U.S. Cl.
CPC ............ *H01L 24/17* (2013.01); *H01L 21/568* (2013.01); *H01L 23/5226* (2013.01); *H01L 24/19* (2013.01); *H01L 24/81* (2013.01); *H01L 24/97* (2013.01); *H01L 25/105* (2013.01); *H01L 25/50* (2013.01); *H01L 2224/0401* (2013.01); *H01L 2224/04105* (2013.01); *H01L 2224/06181* (2013.01); *H01L 2224/11002* (2013.01); *H01L 2224/12105* (2013.01); *H01L 2224/131* (2013.01); *H01L 2224/13147* (2013.01); *H01L 2224/1403* (2013.01); *H01L 2224/14051* (2013.01); *H01L 2224/14181* (2013.01); *H01L 2224/16145* (2013.01); *H01L 2224/16237* (2013.01); *H01L 2224/17181* (2013.01); *H01L 2224/73204* (2013.01); *H01L 2224/73267* (2013.01); *H01L 2224/81005* (2013.01); *H01L 2224/92125* (2013.01);
(Continued)

(58) Field of Classification Search
None
See application file for complete search history.

(56) References Cited

U.S. PATENT DOCUMENTS 5,353,498 A * 10/1994 Fillion ................. H01L 21/568
257/E21.505
6,281,576 B1 * 8/2001 Hakey ..................... H01L 24/10
257/723

(Continued)

*Primary Examiner* — David E Graybill
(74) *Attorney, Agent, or Firm* — Slater Matsil, LLP

(57) ABSTRACT

A method includes forming a first composite wafer including molding a plurality of device dies and a plurality of through-vias in a first molding material, and forming redistribution lines on opposite sides of the first molding material. The redistribution lines are inter-coupled through the plurality of through-vias. The method further includes forming a second composite wafer including stacking a plurality of dies to form a plurality of die stacks, and molding the plurality of die stacks in a second molding material. The second molding material fills gaps between the plurality of die stacks. The first composite wafer is bonded to the second composite wafer to form a third composite wafer.

19 Claims, 19 Drawing Sheets

(51) Int. Cl.
 *H01L 23/522* (2006.01)
 *H01L 21/56* (2006.01)
 *H01L 25/10* (2006.01)
 *H01L 25/00* (2006.01)

(52) U.S. Cl.
 CPC *H01L 2224/97* (2013.01); *H01L 2225/06513* (2013.01); *H01L 2225/06541* (2013.01); *H01L 2225/1035* (2013.01); *H01L 2225/1058* (2013.01); *H01L 2924/1431* (2013.01); *H01L 2924/1434* (2013.01)

(56) References Cited

U.S. PATENT DOCUMENTS

| | | | | |
|---|---|---|---|---|
| 7,642,128 B1* | 1/2010 | Lin | | H01L 21/6835 257/E21.508 |
| 8,097,490 B1* | 1/2012 | Pagaila | | H01L 21/561 257/E21.007 |
| 8,097,526 B2* | 1/2012 | Atkinson | | H01L 23/5389 257/692 |
| 8,101,460 B2* | 1/2012 | Pagaila | | H01L 21/561 257/659 |
| 8,174,109 B2* | 5/2012 | Uchiyama | | H01L 21/486 257/686 |
| 8,318,541 B2* | 11/2012 | Shin | | H01L 25/16 257/E21.499 |
| 8,331,102 B2* | 12/2012 | Inagaki | | H01G 4/224 361/764 |
| 8,519,544 B2* | 8/2013 | Kim | | H01L 24/97 257/774 |
| 8,658,467 B2* | 2/2014 | Park | | H01L 21/563 438/107 |
| 8,669,651 B2* | 3/2014 | Yang | | H01L 23/5385 257/686 |
| 8,669,653 B2* | 3/2014 | Oi | | H01L 21/6835 257/643 |
| 8,884,431 B2* | 11/2014 | Lin | | H01L 23/49816 257/686 |
| 8,975,741 B2* | 3/2015 | Lin | | H01L 24/24 257/700 |
| 9,093,337 B2* | 7/2015 | Hwang | | H01L 24/96 |
| 9,123,763 B2* | 9/2015 | Yu | | H01L 21/568 |
| 9,165,887 B2* | 10/2015 | Hsiao | | H01L 24/24 |
| 9,171,790 B2* | 10/2015 | Yu | | H01L 25/50 |
| 9,177,832 B2* | 11/2015 | Camacho | | H01L 23/49827 |
| 9,219,029 B2* | 12/2015 | Do | | H01L 23/3107 |
| 9,293,442 B2* | 3/2016 | Su | | H01L 24/17 |
| 9,307,632 B2* | 4/2016 | Lee | | H05K 1/0271 |
| 9,324,672 B2* | 4/2016 | Pagaila | | H01L 24/19 |
| 2005/0048698 A1* | 3/2005 | Yamaguchi | | H01L 21/76898 438/109 |
| 2009/0004777 A1* | 1/2009 | Kolan | | H01L 25/0657 438/109 |
| 2009/0008798 A1* | 1/2009 | Yoshida | | H01L 21/76898 257/777 |
| 2010/0006994 A1* | 1/2010 | Shim | | H01L 21/561 257/676 |
| 2010/0072599 A1* | 3/2010 | Camacho | | H01L 21/6835 257/686 |
| 2010/0112756 A1* | 5/2010 | Amrine | | H01L 21/568 438/113 |
| 2010/0244208 A1* | 9/2010 | Pagaila | | H01L 21/568 257/659 |
| 2010/0244230 A1* | 9/2010 | Oi | | H01L 21/6835 257/692 |
| 2010/0252937 A1* | 10/2010 | Uchiyama | | H01L 21/486 257/777 |
| 2011/0101518 A1* | 5/2011 | Cho | | H01L 24/11 257/737 |
| 2012/0038034 A1* | 2/2012 | Shin | | H01L 25/16 257/676 |
| 2012/0080832 A1* | 4/2012 | Woodard | | B23Q 3/084 269/289 R |
| 2012/0199972 A1* | 8/2012 | Pagaila | | H01L 21/6835 257/737 |
| 2012/0208319 A1* | 8/2012 | Meyer | | H01L 25/16 438/107 |
| 2012/0329249 A1* | 12/2012 | Ahn | | H01L 21/78 438/464 |
| 2013/0026654 A1* | 1/2013 | Shin | | H01L 25/16 257/774 |
| 2013/0032946 A1* | 2/2013 | West | | H01L 21/78 257/774 |
| 2013/0093078 A1* | 4/2013 | Lin | | H01L 24/24 257/737 |
| 2013/0093097 A1* | 4/2013 | Yu | | H01L 21/568 257/774 |
| 2013/0105979 A1* | 5/2013 | Yu | | H01L 24/97 257/762 |
| 2013/0182402 A1* | 7/2013 | Chen | | H01L 23/49827 361/807 |
| 2013/0241071 A1* | 9/2013 | Hsieh | | H01L 24/13 257/773 |
| 2013/0270682 A1* | 10/2013 | Hu | | H01L 23/5389 257/666 |
| 2014/0027901 A1* | 1/2014 | Hu | | H01L 21/6835 257/737 |
| 2014/0070422 A1* | 3/2014 | Hsiao | | H01L 24/24 257/774 |
| 2014/0076617 A1* | 3/2014 | Chen | | H01L 23/49816 174/255 |
| 2014/0077394 A1* | 3/2014 | Chang | | H01L 23/4334 257/782 |
| 2014/0103488 A1* | 4/2014 | Chen | | H01L 23/5389 257/532 |
| 2014/0262475 A1* | 9/2014 | Liu | | H01L 23/5389 174/377 |
| 2014/0264857 A1* | 9/2014 | Wu | | H01L 21/6835 257/738 |
| 2014/0264905 A1* | 9/2014 | Lee | | H01L 21/568 257/774 |
| 2014/0367848 A1* | 12/2014 | Chi | | H01L 24/24 257/737 |
| 2015/0091157 A9* | 4/2015 | Chi | | H01L 23/49827 257/737 |
| 2015/0093858 A1* | 4/2015 | Hwang | | H01L 24/96 438/113 |
| 2015/0171034 A1* | 6/2015 | Yu | | H01L 24/02 257/777 |
| 2015/0187734 A1* | 7/2015 | Liu | | H01L 25/0657 257/621 |
| 2015/0200188 A1* | 7/2015 | Yu | | H01L 24/19 257/704 |
| 2015/0206865 A1* | 7/2015 | Yu | | H01L 25/18 257/737 |
| 2015/0206866 A1* | 7/2015 | Yu | | H01L 25/18 257/738 |
| 2015/0228550 A1* | 8/2015 | Yu | | H01L 22/32 257/48 |
| 2015/0262909 A1* | 9/2015 | Chen | | H01L 23/481 257/774 |
| 2015/0262972 A1* | 9/2015 | Katkar | | H01L 21/561 257/48 |
| 2015/0333026 A1* | 11/2015 | Gandhi | | H01L 24/13 257/737 |
| 2015/0357302 A1* | 12/2015 | Chen | | H01L 24/25 257/773 |

* cited by examiner

METHODS FOR FORMING FAN-OUT PACKAGE STRUCTURE

BACKGROUND

Stacked dies are commonly used in Three-Dimensional (3-D) integrated circuits. Through the stacking of dies, the footprint of packages is reduced. In addition, the metal line routing in the dies is significantly simplified through the formation of stacked dies.

In some applications, a plurality of stacked dies is stacked to form a die stack. The total count of the stacked dies may sometimes reach eight or more. In the formation of a die stack, a first die is first bonded onto a package substrate through flip-chip bonding, wherein solder regions/balls are reflowed to join the first die to the package substrate. A first underfill is dispensed into the gap between the first die and the package substrate. The first underfill is then cured. A test is then performed to ensure that the first die is connected to the package substrate correctly and that the first die and the package substrate function as desired.

Next, a second die is bonded onto the first die through flip-chip bonding, wherein solder regions/balls are reflowed to join the second die to the first die. A second underfill is dispensed into the gap between the second die and the first die. The second underfill is then cured. A test is then performed to ensure that the second die is connected to the first die and the package substrate correctly and that the first die, the second die, and the package substrate function as desired. Next, a third die is bonded onto the second die through the same process steps used for bonding the first die and the second die. The processes are repeated until all the dies are bonded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
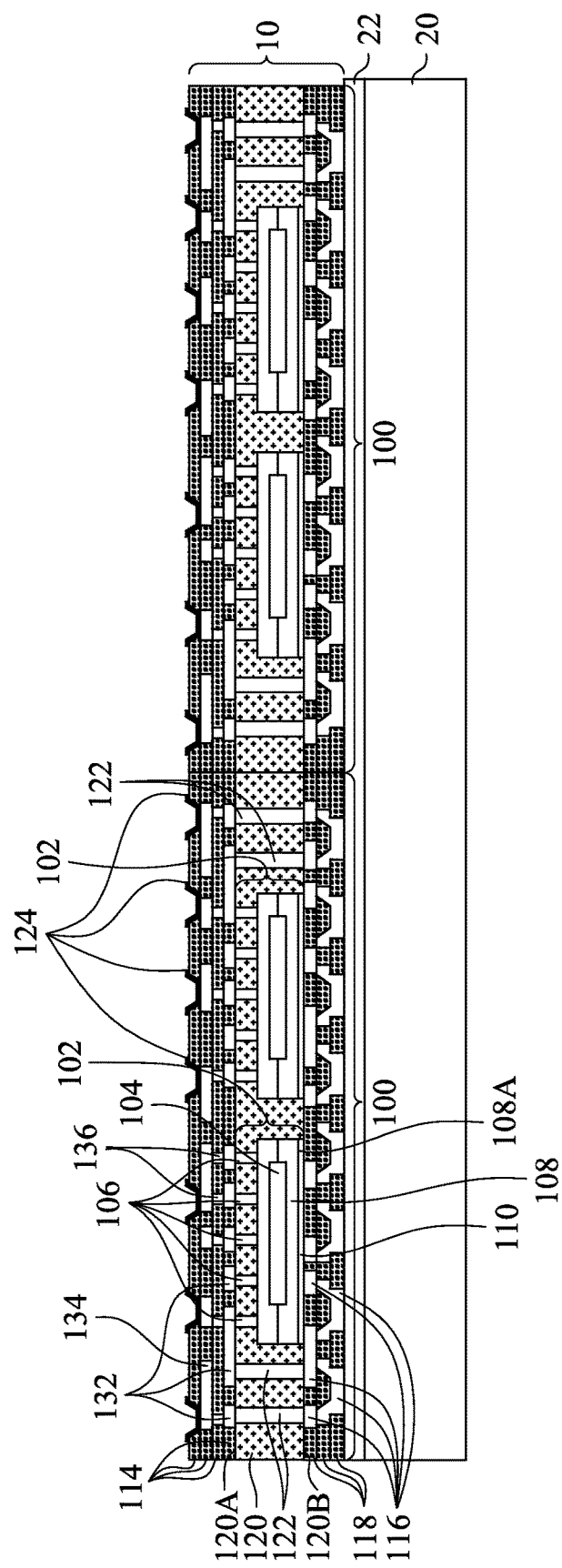
FIGS. 1 through 4 illustrate the cross-sectional views of intermediate stages in the formation of a wafer-level package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit package and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

FIGS. 1 through 4 illustrate the cross-sectional views of intermediate stages in the formation of an interconnect structure in accordance with some embodiments. FIG. 1 illustrates a cross-sectional view of package 10 in accordance with some embodiments. Package 10 includes a plurality of packages 100 that are identical to each other. In some embodiments, package 100 includes device dies 102, with the front sides of device dies 102 facing and bonded to Redistribution Layers (RDLs) 132/134/136. Throughout the description, the term "RDL" also refers to the redistribution lines in the redistribution layers and the vias interconnecting the redistribution lines. In alternative embodiments, package 100 includes a single device die or more than two device dies. Device die 102 may include semiconductor substrate 108 and integrated circuit devices 104 (such as active devices, which include transistors, for example) at the front surface (the surface facing up in FIG. 1) of semiconductor substrate 108. Device die 102 may include a logic die such as a Central Processing Unit (CPU) die, a Graphic Processing Unit (GPU) die, a mobile application die, or the like.

Device dies 102 are molded in molding material 120, which surrounds each of device dies 102. Molding material 120 may be a molding compound, a molding underfill, a resin, an epoxy, or the like. The top surface 120A of molding material 120 may be level with the bottom ends of device dies 102. The bottom surface 120B of molding material 120 may be level with or higher than back surface 108A of semiconductor substrate 108. In some embodiments, back surface 108A of semiconductor substrate 108 overlaps, and is attached to, die-attach film 110, which is a dielectric film adhering device die 102 to the underlying dielectric layer 118. Device die 102 further includes metal pillars/pads 106 (which may include metal pillars such as copper pillars, for example) in contact with, and bonded to, RDLs 132.

Package 100 may include front-side RDLs 132/134/136 overlying device dies 102, and backside RDLs 116 underlying device dies 102. Front-side RDLs 132/134/136 are formed in dielectric layers 114, and backside RDLs 116 are formed in dielectric layers 118. RDLs 132/134/136 and 116 may be formed of copper, aluminum, nickel, titanium, alloys thereof, or multi-layers thereof. In some embodiments, dielectric layers 114 and 118 are formed of organic materials such as polymers, which may further include polybenzoxazole (PBO), benzocyclobutene (BCB), polyimide, or the like. In alternative embodiments, dielectric layers 114 and 118 are formed of inorganic material such as silicon oxide, silicon nitride, silicon oxynitride, or the like.

Through-Vias 122 are formed to penetrate through molding material 120. In some embodiments, through-vias 122 have top surfaces level with the top surface 120A of molding material 120 and bottom surfaces level with the bottom surface 120B of molding material 120. Through-Vias 122 electrically couple front-side RDLs 132/134/136 to backside RDLs 116. Through-Vias 122 may also be in physical contact with front-side RDLs 132 and backside RDLs 116.

Electrical connectors 124, which are formed of a non-solder metallic material(s), are formed at the bottom surface of package 100. In some embodiments, electrical connectors 124 include Under-Bump Metallurgies (UBMs), which are also metal pads. In alternative embodiments, electrical connectors 124 include metal pillars. Electrical connectors 124 may comprise copper, aluminum, titanium, nickel, palladium, gold, or multi-layers thereof.

In accordance with some embodiments of the present disclosure, RDLs 132/134/136 include portions (including 132 and 134) in more than one metal layer and vias 136, interconnecting the RDLs in different metal layers. For example, FIG. 1 illustrates RDLs 132, which are closest to through-vias 122. The top surfaces of through-vias 122 are in contact with some of RDLs 132. Furthermore, metal pillars 106 of device die 102 may also be in contact with some of RDLs 132. Electrical connectors 124 are electrically coupled to, and may be in physical contact with, RDLs 134. Hence, RDLs 134 may be in the metal layer that is closest to electrical connectors 124. Vias 136 are disposed between, and electrically interconnect, RDLs 132 and RDLs 134 in some exemplary embodiments.

In accordance with some embodiments of the present disclosure, package 10 is formed starting from carrier 20 and release layer 22. Carrier 20 is a glass carrier in some exemplary embodiments. Release layer 22 may be an adhesive. In some embodiments, a metal layer (not shown) is formed over removal layer 22 as a seed layer for the subsequent plating process for forming RDLs 116. The bottom dielectric layer 118, which may be a polymer layer such as polybenzoxazole (PBO), benzocyclobutene (BCB), or the like, is formed over release layer 22, and is then patterned. RDLs 116 are then formed through plating in some exemplary embodiments. Dielectric layer 118 and more layers of RDLs 116 may be formed layer by layer.

Next, through-vias 122 is formed over dielectric layers 118 and electrically coupled to RDLs 116, wherein through-vias 122 may be formed through plating. Device dies 102 are placed over dielectric layers 118 and electrically coupled to RDLs 116, wherein die-attach films 110 are used to adhere dies 102 to the underlying structures. The placement of device dies 102 may be performed before or after the formation of through-vias 122. Next, molding material 120 is applied to mold device dies 102 and through-vias 122 therein. The molding may be an expose molding so that metal pillars/pads 106 and through-vias 122 are exposed. Alternatively, metal pillars/pads 106 and through-vias 122 are molded in molding material 120, and a grinding is performed to expose metal pillars/pads 106 and through-vias 122. In subsequent process steps, dielectric layers 114, RDLs 132, 134, and 136 and electrical connectors 124 are formed.

Figure 2:
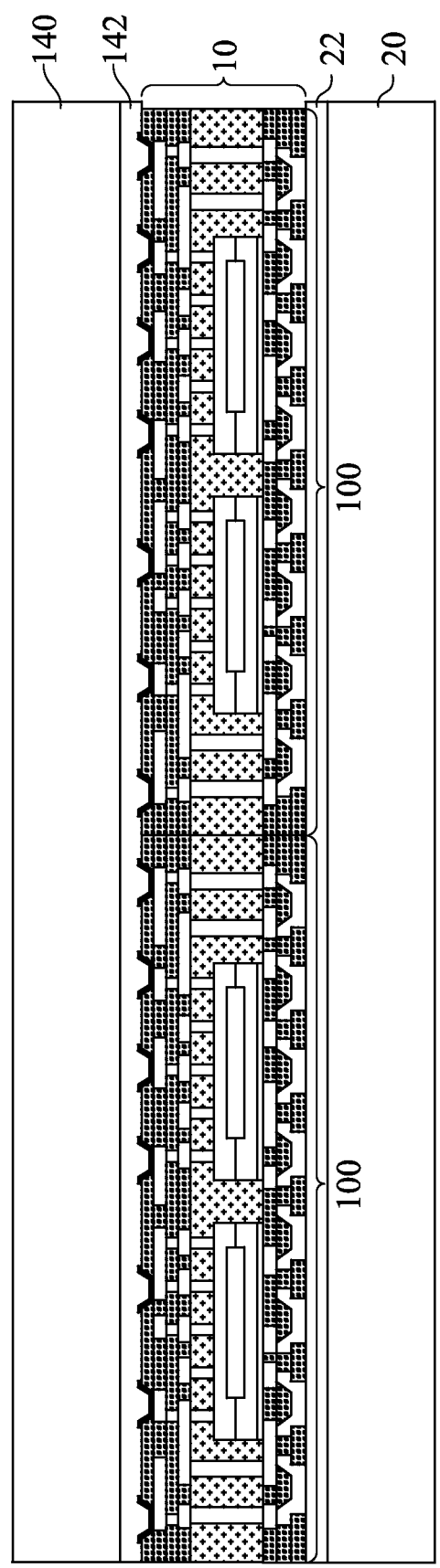
Figure 3:
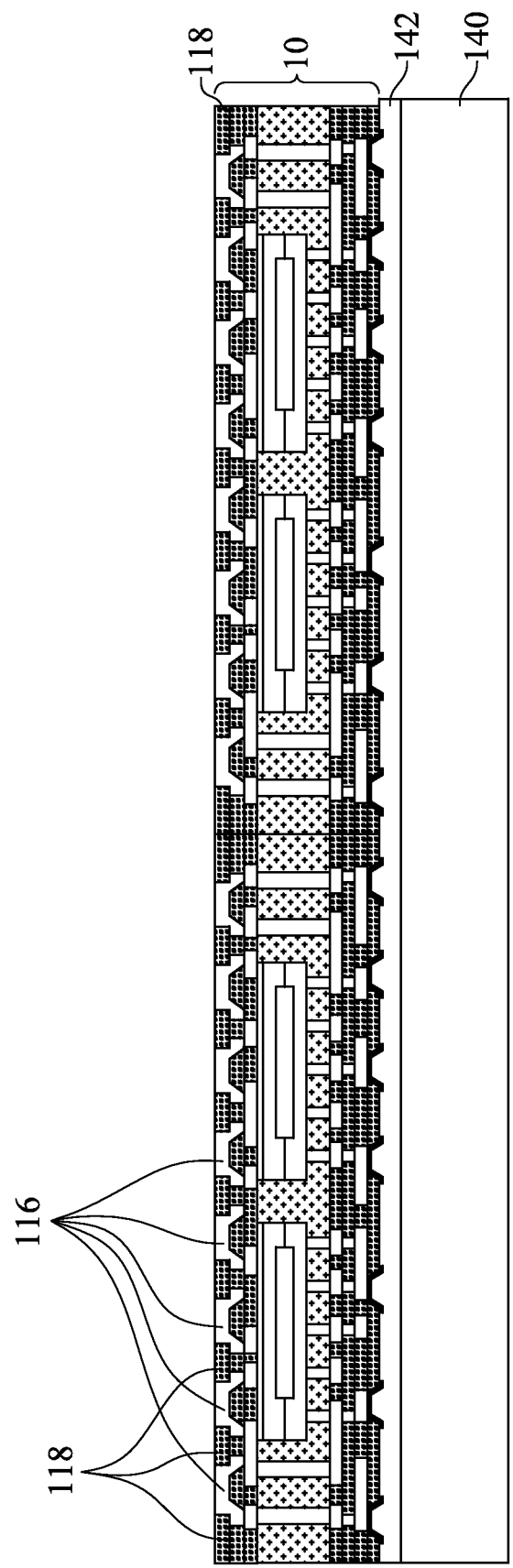

FIGS. 2 and 3 illustrate a carrier swap process wherein carrier 20, which is adhered to the backside of package 10, is removed, and another carrier is adhered to the front-side of package 10. Referring to FIG. 2, carrier 140 is adhered to package 10 through adhesive 142, wherein carriers 20 and 140 are on the opposite sides of package 10. Carrier 140 may also be a glass carrier in some embodiment.

Next, package 10 and carrier 140 are demounted from carrier 20, and the resulting structure is shown in FIG. 3. In some embodiments, release layer 22 comprises a light to heat conversion material, which decomposes when exposed to laser light or Ultra-Violet (UV) light. In alternative embodiments, release layer 22 (FIG. 2) is an UV adhesive, which loses adhesion when exposed to UV light. Accordingly, in the demounting of package 10, a laser light or UV light is projected on release layer 22 through carrier 20 so that carrier 20 may be removed. The remaining adhesive attached to package 10 is cleaned.

Figure 4:
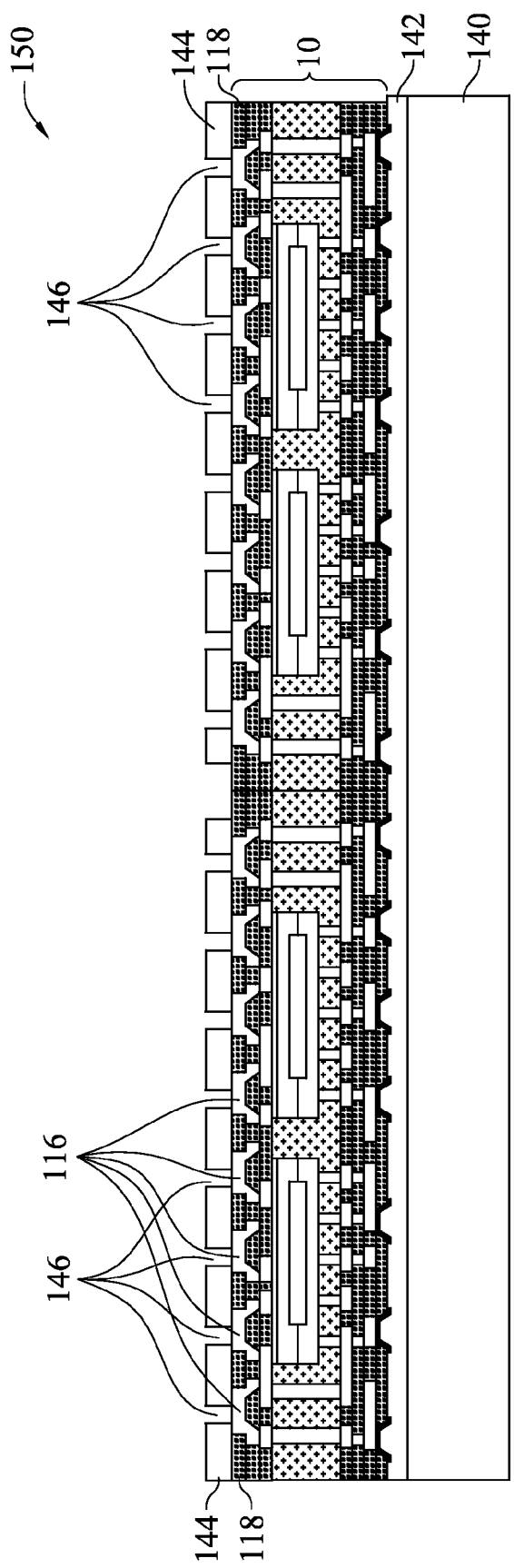
Figure 15:
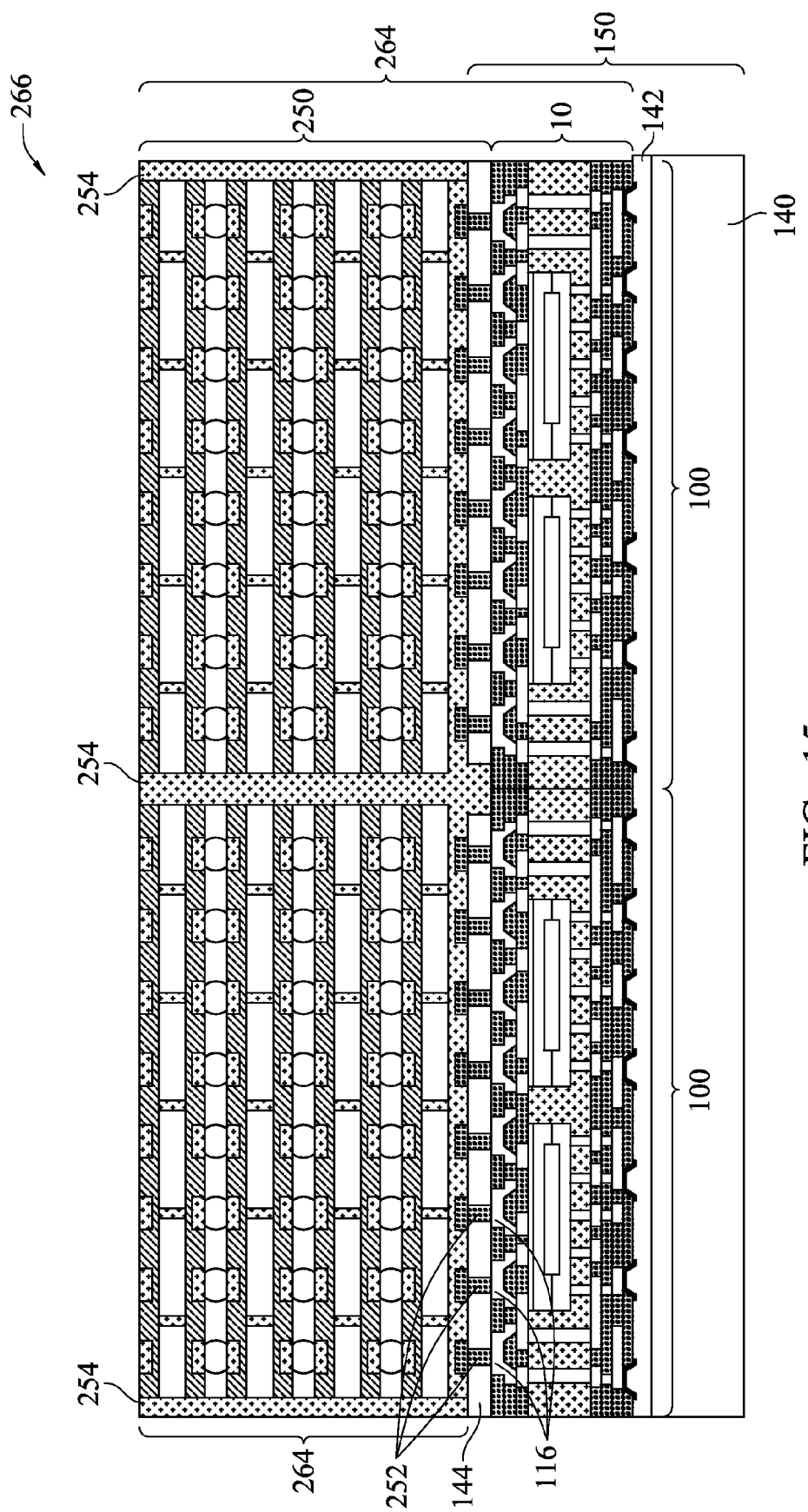

As shown in FIG. 3, since the top dielectric layer 118 and top RDLs 116 are formed starting from a planar surface (FIG. 1), the top surface of top dielectric layer 118 and the top surfaces of top RDLs 116 are coplanar. In accordance with some embodiments, as shown in FIG. 4, polymer film 144 is laminated on the top surfaces of top dielectric layer 118 and top RDLs 116. Polymer film 144 is also referred to as a patternable underfill since it has the function of the underfill, which is to protect the subsequently formed bonds (as shown in FIG. 15) from the damage of mechanical forces and to prevent moisture from reaching the bonds. In some exemplary embodiments, polymer film 144 is formed of PBO, BCB, or the like. Openings 146 are formed in polymer film 144. In some embodiments, openings 146 are formed through laser drill, etching, or the like. Hence, the formation of package 10 is finished. Throughout the description, package 10 and the overlying film 144 will be in combination referred to as composite wafer 150. In some embodiments, as shown in FIG. 4, composite wafer 150 may include carrier 140.

In alternative embodiments of the present disclosure, polymer film 144 is not formed. The resulting composite wafer 150 thus has exposed top dielectric layer 118 and exposed top RDLs 116 as the topmost features.

Figure 14A:
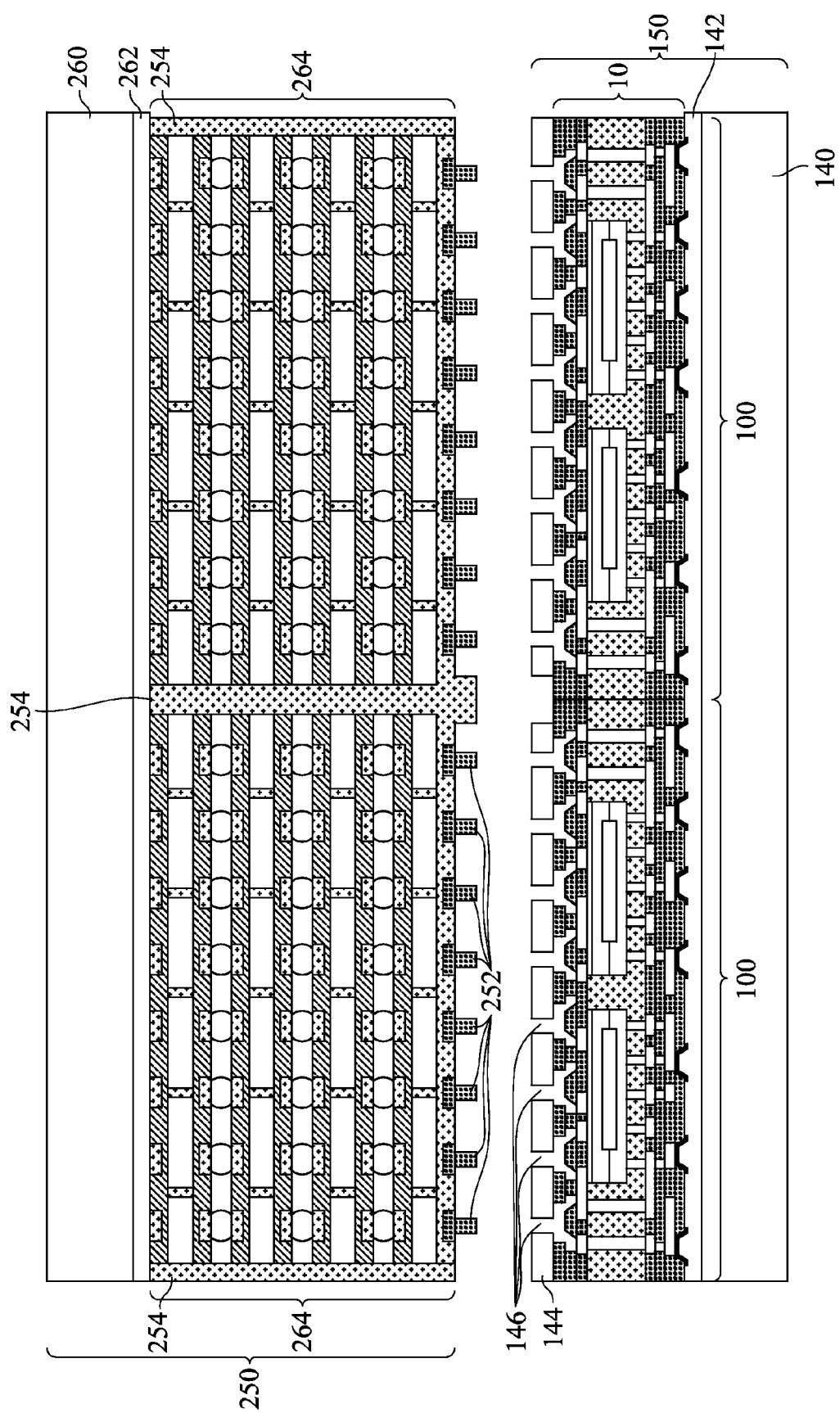
FIGS. 14A through 17 illustrate the cross-sectional views and top views of intermediate stages in the bonding of a wafer-level package to wafer-level die stacks in accordance with some embodiments.
Figure 14B:
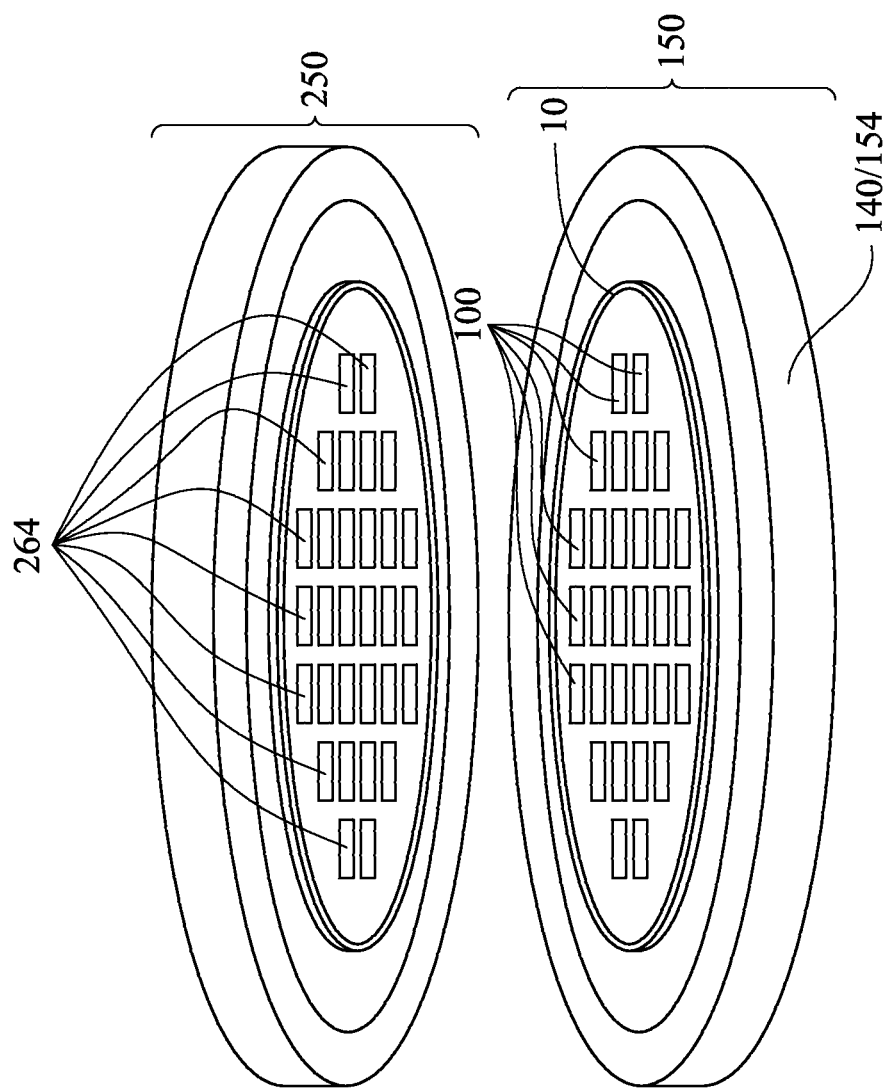

FIG. 14B illustrates a perspective view of package 10. In some embodiments, package 10 and composite wafer 150 both have the round shape of a wafer and hence are also referred to as wafer-form package 10 hereinafter. Package 10 may also have the same sizes as typical wafers such as 8 inches, 12 inches, or the like. Accordingly, the formation of package 10 may use the existing processes, materials, and tools for processing semiconductor wafers. As shown in FIG. 15, composite wafer 150 includes a plurality of packages 100 therein, which are similar to, and can be processed using the same methods as, the chips in typical wafers.

FIGS. 5 through 9 illustrate cross-sectional views of intermediate stages in the formation of package 10 in accordance with alternative embodiments. These embodiments are similar to the embodiments shown in FIGS. 1 through 4, except that solder balls 152 (FIG. 6) are formed on package 10 in these embodiments. Unless specified otherwise, the materials and the formation methods of the components in these embodiments are essentially the same as their like components, which are denoted by like reference numerals in the embodiments shown in FIGS. 1 through 4. The details regarding the formation process and the materials of the components shown in FIGS. 5 through 9 may thus be found in the discussion of the embodiment shown in FIGS. 1 through 4.

Figure 5:
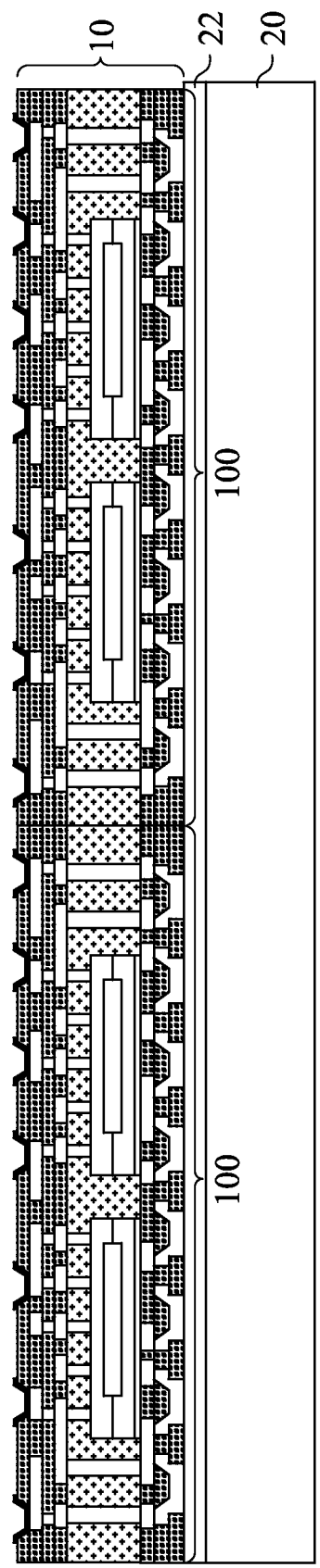
FIGS. 5 through 9 illustrate the cross-sectional views of intermediate stages in the formation of a wafer-level package in accordance with alternative embodiments.
Figure 6:
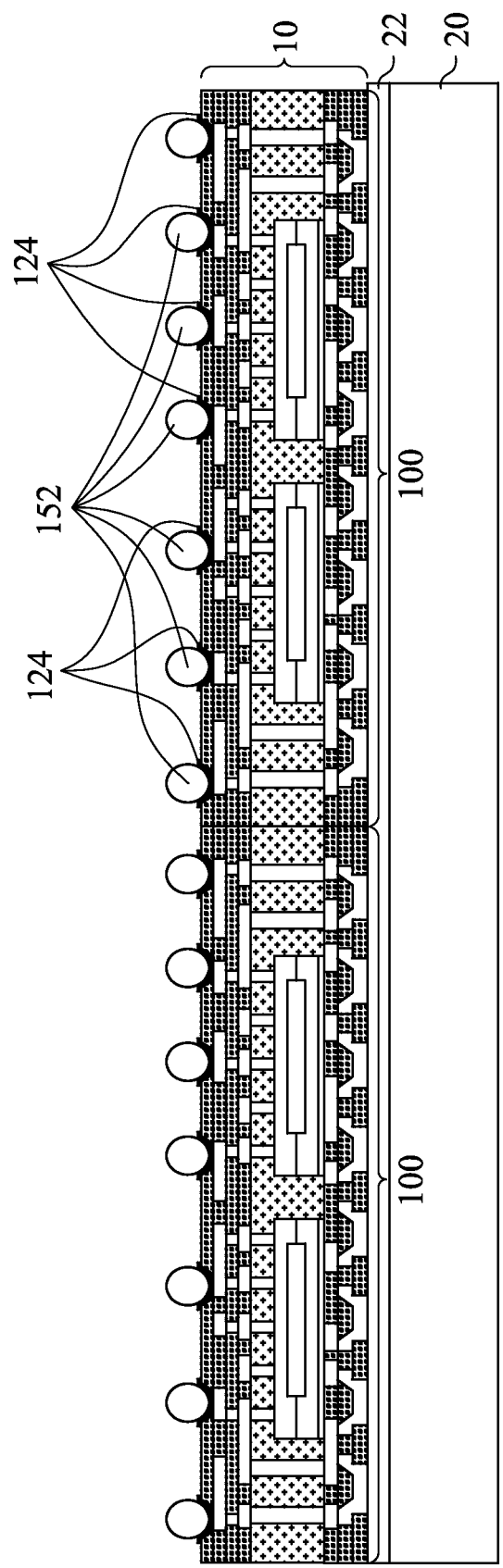

The initial steps of these embodiments are essentially the same as shown in FIG. 1, wherein the resulting structure is shown in FIG. 5. Next, referring to FIG. 6, solder balls 152 are formed on electrical connectors 124. In accordance with some embodiments, solder balls 152 are placed on electrical connectors 124, followed by a reflow process. In alternative embodiments, solder balls 152 are formed by plating a solder layer on electrical connectors 124 and then performing a reflow.

Figure 7:
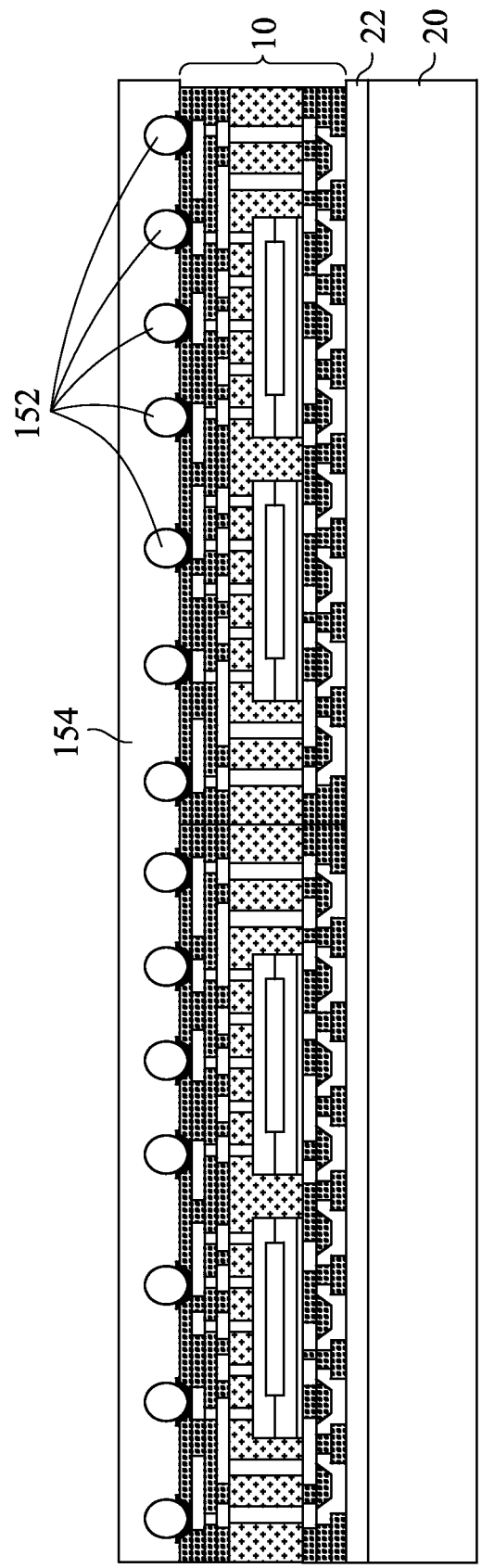
Figure 8:
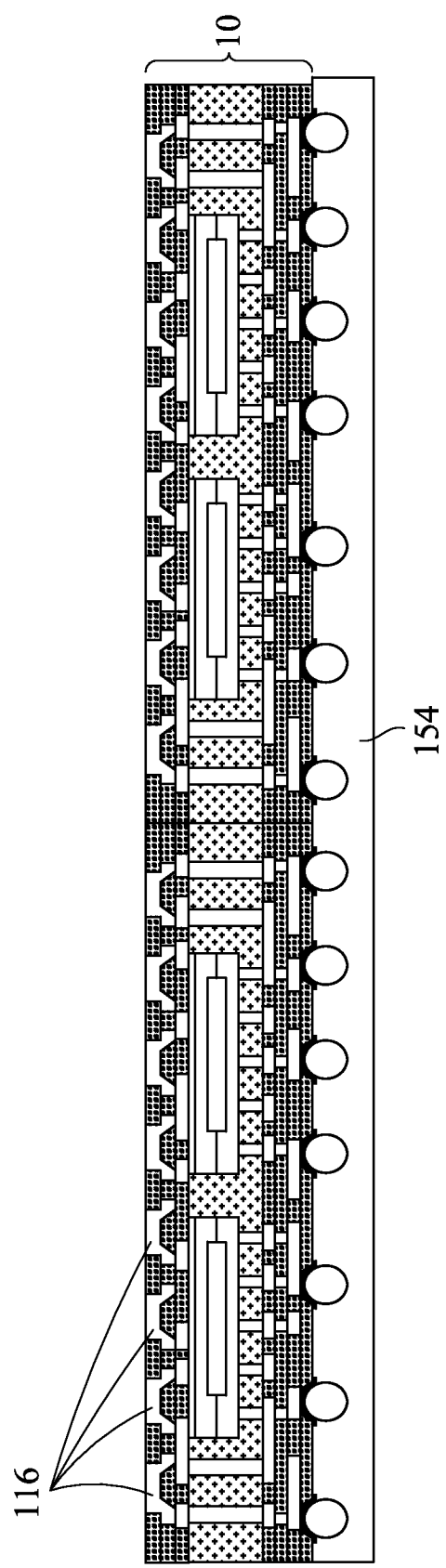

Referring to FIG. 7, tape 154 is adhered to the front-side of package 10, wherein solder balls 152 are pressed into tape 154 and are protected by tape 154. Next, package 10 and tape 154 are demounted from carrier 20. The resulting structure is shown in FIG. 8. In some embodiments, release layer 22 is a light to heat conversion layer. Accordingly, in the demounting of package 10, a laser light or UV light is projected on release layer 22 through carrier 20 so that release layer 22 is decomposed and carrier 20 may be removed. The remaining adhesive attached to package 10 is cleaned.

Figure 9:
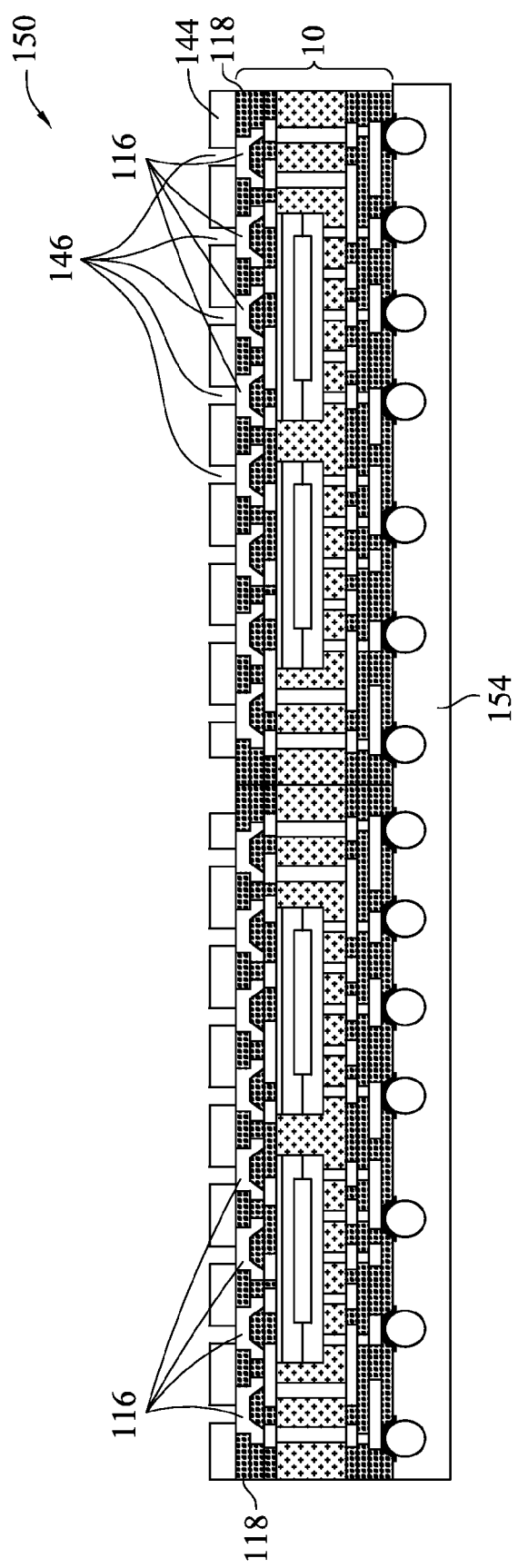

FIG. 9 illustrates the formation of polymer film 144, which may be laminated on the top surfaces of top dielectric layer 118 and top RDLs 116. Openings 146 are then formed in polymer film 144. In some embodiments, openings 146 are formed through laser drill, etching, or the like. Portions of RDLs 116, which are the pad portions, are thus exposed through openings 146. Hence, the formation of (a first) composite wafer 150 is finished. In these embodiments, composite wafer 150 includes tape 154 and package 10. Also, as shown in FIG. 14A, composite wafer 150 also has a round top view shape.

FIGS. 10 through 13 illustrate the cross-sectional views of intermediate stages in the formation of composite wafer 250 in accordance with some exemplary embodiments, wherein composite wafer 250 is to be bonded to composite wafer 150 in subsequent steps.

Figure 10:
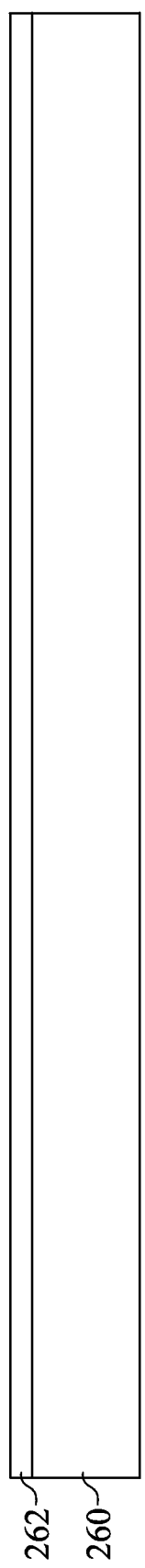
FIGS. 10 through 13 illustrate the cross-sectional views of intermediate stages in the formation of wafer-level die stacks in accordance with some embodiments.

Referring to FIG. 10, carrier 260 and release layer 262 are provided. Carrier 260 may be a glass carrier and have a rounded top-view shape. The size of carrier 260 (and the size of the respective composite wafer 250 in FIG. 13) may also be close to the size of composite wafer 150. For example, the diameter of carrier 260 and the diameter of composite wafer 150 may have a difference smaller than 5 percent of both the diameter of carrier 260 and the diameter of composite wafer 150. In some embodiments, release layer 262 comprises a light to heat conversion layer, which may be decomposed when exposed to certain forms of light (such as laser light).

Figure 11:
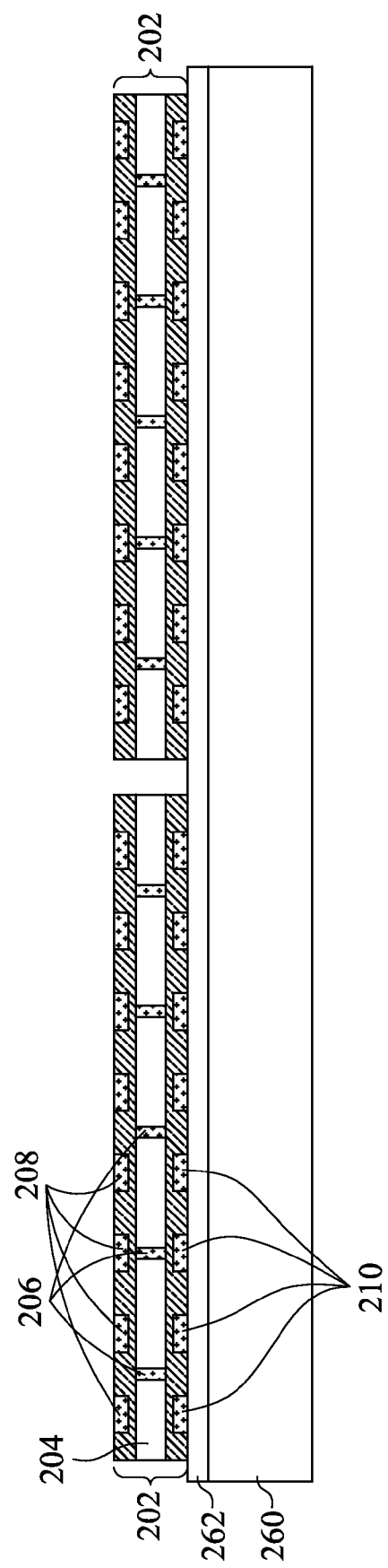

Referring to FIG. 11, device dies 202 are placed on release layer 262. In accordance with some embodiments of the present disclosure, device dies 202 are memory device dies, which may include Static Random Access Memory (SRAM) device dies, Dynamic Random Access Memory (DRAM) device dies, Magneto-Resistive Random Access Memory (MRAM) device dies, or the like. In alternative embodiments, device dies 202 are logic device dies that include logic circuits such as mobile application circuits, for example. In some embodiments, the circuits in device dies 202 are identical to each other and are spaced apart from each other. The pitches of device dies 202 are selected to be the same as the pitches of packages 100 in FIG. 4 or 9 so that in a subsequent process step device dies 202 may be bonded to packages 100 with a one-to-one correspondence.

In accordance with some embodiments of the present disclosure, each of device dies 202 includes semiconductor substrate 204, wherein the active devices (not shown) such as transistors are formed at a surface of semiconductor substrate 204. In some embodiments, semiconductor substrate 204 is a crystalline silicon substrate. In alternative embodiments, semiconductor substrate 204 includes another semiconductor material such as germanium, silicon germanium, a III-V compound semiconductor material, or the like. Metal lines and vias (not shown) are formed in the interconnect structures of device dies 202 to interconnect the integrated circuit devices in device dies 202.

Through-vias 206 are formed to penetrate through semiconductor substrate 204. Additional electrical connectors 208 are formed on the top surfaces of device dies 202. Electrical connectors 210 are formed at the bottom surfaces of device dies 202. Electrical connectors 208 and 210 may be metal pads, metal pillars, or the like. Electrical connectors 208 may be electrically coupled to electrical connectors 210 through through-vias 206.

Figure 12:
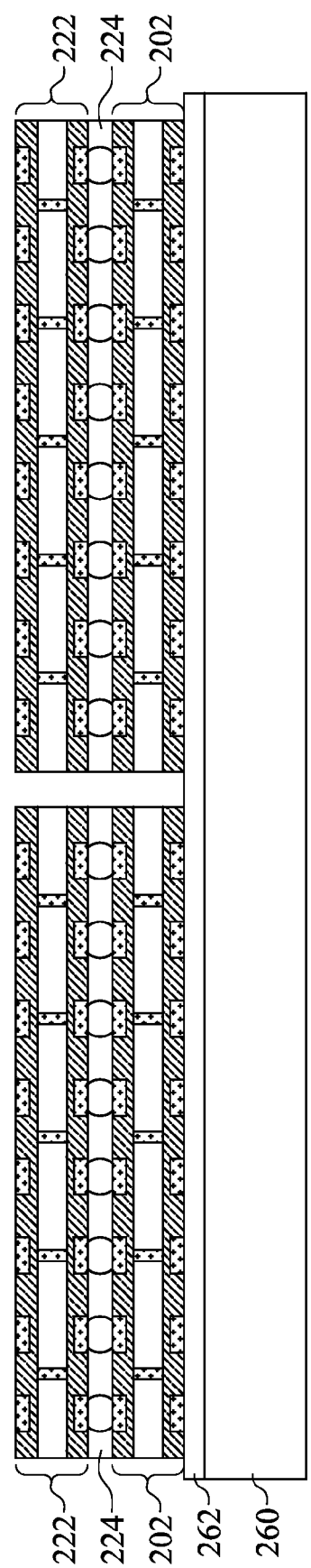

FIG. 12 illustrates the bonding of device dies 222 and the dispensing of underfilling material 224, which may be an underfill, a Non-Conductive Paste (NCP), or a Non-Conductive Film (NCF). First, device dies 222 are bonded to device dies 202 with a one-to-one correspondence. In some embodiments, device dies 222 are identical to device dies 202. In these embodiments, device dies 202 and 222 may be formed using identical process steps, wherein the different reference numerals 202 and 222 are merely used to indicate that they are at different levels in the die stacks. In alternative embodiments, device dies 202 and 222 have different structures, including different circuits and/or different metal routing, etc.

Next, as also shown in FIG. 12, underfilling material 224 is dispensed and cured. In some embodiments, underfilling material 224 is dispensed into the gaps between device dies 202 and the respective overlying device dies 222. The gaps between neighboring device dies 222 are not dispensed with underfilling material 224. Underfilling material 224 is then cured, for example, in a thermal curing process. The curing may be performed using same conditions as curing underfill 212. For example, the curing may be performed at a temperature in the range between about 100° C. and about 165° C. and for a period of time in the range between about 30 minutes and about 120 minutes. After the curing, underfilling material 224 is solidified. In alternative embodiments, no underfill is dispensed at this stage, while the subsequently formed molding material 54 (FIG. 13) is dispensed between device dies 202 and the respective overlying device dies 222 to act as the underfill.

Figure 13:
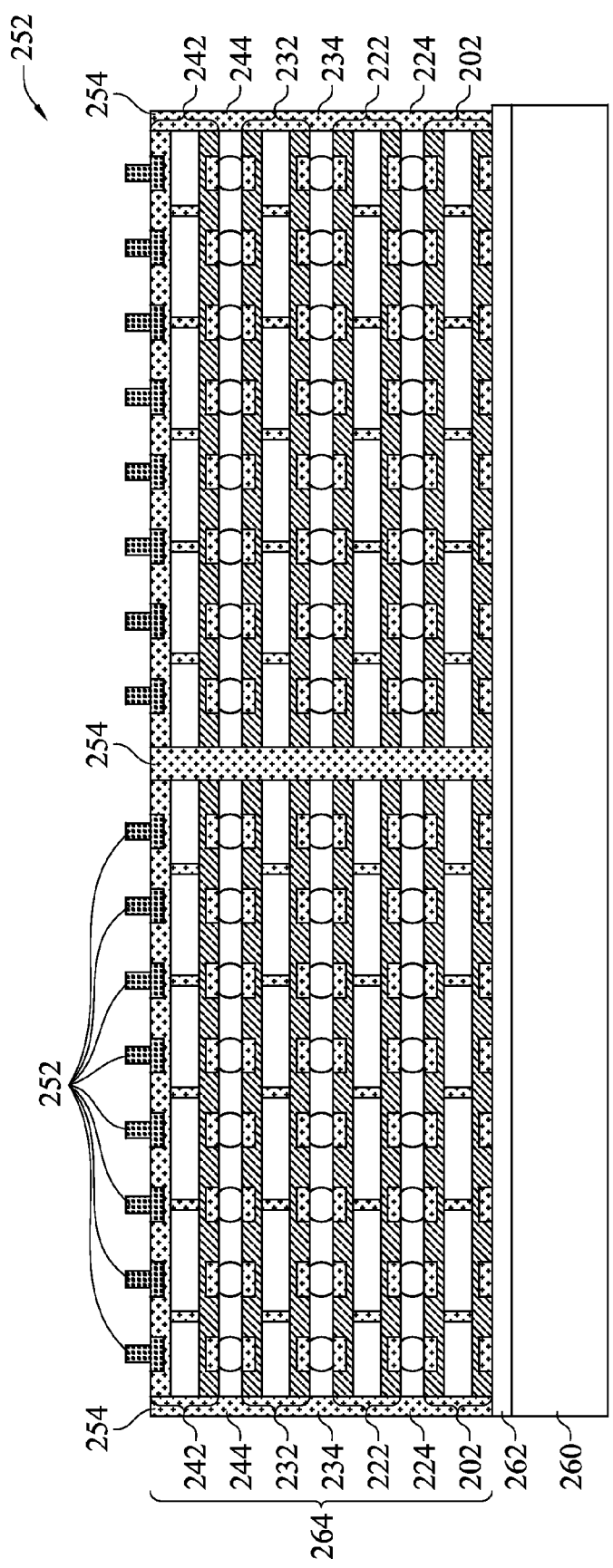

FIG. 13 illustrates the bonding of device dies 232 and the dispensing of underfilling material 234, which may be an underfill, a NCP, or an NCF. Device dies 232 are bonded to device dies 222 with a one-to-one correspondence. Again, device dies 232 may be identical to, or different from, device dies 222 and/or 202. The process for the dispensing and the curing of underfilling material 234 may be the same as the process for the dispensing and the curing of underfilling material 224.

FIG. 13 also illustrates the bonding of device dies 242 and the dispensing of underfilling material 244. Device dies 242 are bonded to device dies 232 with a one-to-one correspondence. Again, device dies 242 may be identical to, or different from, device dies 232, 222, and/or 202. The process for the dispensing and the curing of underfilling material 244 may be the same as the process for the dispensing and the curing of underfilling material 234.

Although not illustrated, additional device dies may be bonded over device dies 242 to increase the stacking level.

Each of the additional device dies may be identical to, or different from, device dies 242, 232, 222, and/or 202. In the resulting structure, a plurality of die stacks 264 are formed, with each of die stacks 264 including device dies 242, 232, 222, and 202. Die stacks 264 are spaced apart from each other by spaces.

Although in the illustrative embodiments, device dies 242, 232, and 222 are bonded to the underlying dies through solder bonding, other applicable bonding methods such as metal-to-metal direct bonding may also be used.

FIG. 13 illustrates the molding of die stacks 264 using molding material 254, which fills the gaps between die stacks 264 and encircles die stack 264. In accordance with some embodiments, the molding is an expose molding, and hence, after the molding process, electrical connectors 252 of the top device dies 242 are exposed. In accordance with some embodiments, molding material 254 includes a molding compound, a molding underfill, or the like. For example, when underfills 224, 234, and 244 are not dispensed in preceding paragraphs, molding material 254 may be a molding underfill and may be dispended into the gap between each of dies 232, 222, and/or 202 and their respective overlying dies. The structure in FIG. 13 is referred to a (second) composite wafer hereinafter, wherein composite wafer 250 includes die stacks 264, molding material 254, and carrier 260.

In some embodiments, electrical connectors 252 include metal pillars such as copper pillars. In alternative embodiments, electrical connectors 252 include solder regions.

Referring to FIG. 14A, composite wafer 250 is aligned with composite wafer 150. Each of die stacks 264 may be aligned with one of packages 100. Furthermore, electrical connectors 252 are aligned with the pad portions (also referred to metal pads 116) of RDLs 116. In the embodiments wherein polymer film 144 exists, electrical connectors 252 are also aligned with openings 146 in polymer film 144.

FIG. 14B illustrates a schematic perspective view of the structure shown in FIG. 14A, wherein composite wafers 150 and 250 are aligned face to face. Accordingly, although each of composite wafers 150 and 250 includes packages and carriers or tapes, the resulting bonding is similar to a wafer-to-wafer bonding.

Next, composite wafer 250 is bonded to composite wafer 150, as shown in FIG. 15. In some embodiments, the bonding is achieved by bonding electrical connectors 252 to metal pads 116 through metal-to-metal bonding. In alternative embodiments, the bonding is performed through solder bonding. In some embodiments, patternable underfill 144 is pre-laminated, and hence after the bond process, patternable underfill 144 occupies the space between die stacks 264 and packages 100. The thickness of patternable underfill 144 may be selected to be equal to the standoff distance between die stacks 264 and packages 100 so that no space is left between die stacks 264 and packages 100.

In alternative embodiments, the bonding between wafer 250 and composite wafer 150 is through solder bonding, and an epoxy flux (not shown) may be used. Accordingly, after the bonding process, the epoxy in the epoxy flux surrounds the bonds. In yet alternative embodiments, no patternable underfill 144 is pre-laminated, and after the bonding process, an underfilling process is performed to dispose an underfill (also illustrated as 144) into the gaps between composite wafer 250 and the underlying composite wafer 150.

After the bonding process, a carrier demounting is performed to remove carrier 260 and release layer 262 (FIG. 14A). Throughout the description, the structure shown in FIG. 15, which includes package 10 and die stacks 264, will be referred to as (a third) composite wafer or package 266. Next, referring to FIG. 16, carrier 140 as shown in FIG. 15 is removed, and tape 268 is attached to package 266. Tape 268 may be attached to either one of the sides of package 266.

Figure 16:
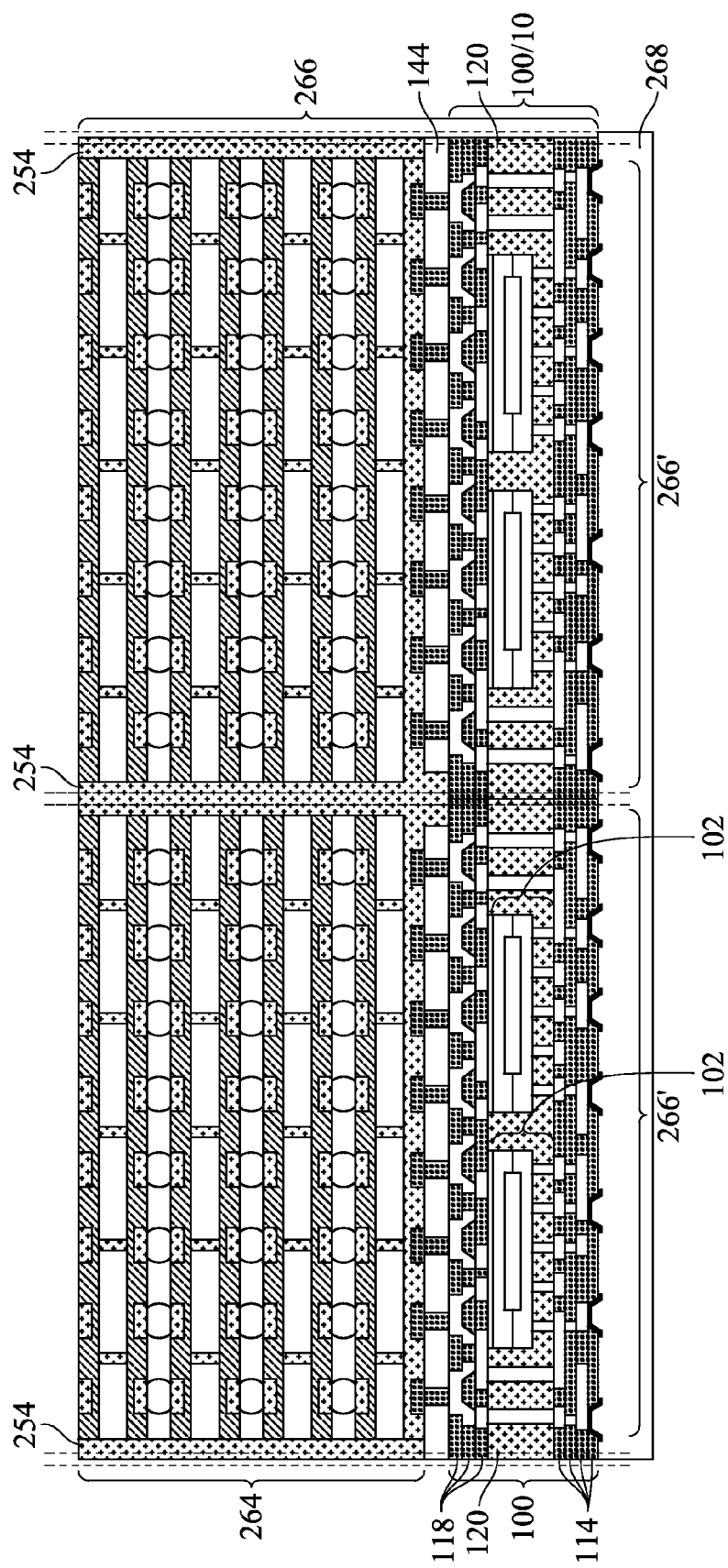

FIG. 16 also illustrates the die saw process, wherein package 266 is sawed (along the dashed lines) into a plurality of packages 266'. Each of packages 266' includes one of packages 100 (referred to as a first package component hereinafter) and one of die stacks 264 and the respective molding material 254, wherein each of die stacks 264 and the respective molding material 254 is collectively referred to as a second package component.

Figure 17:
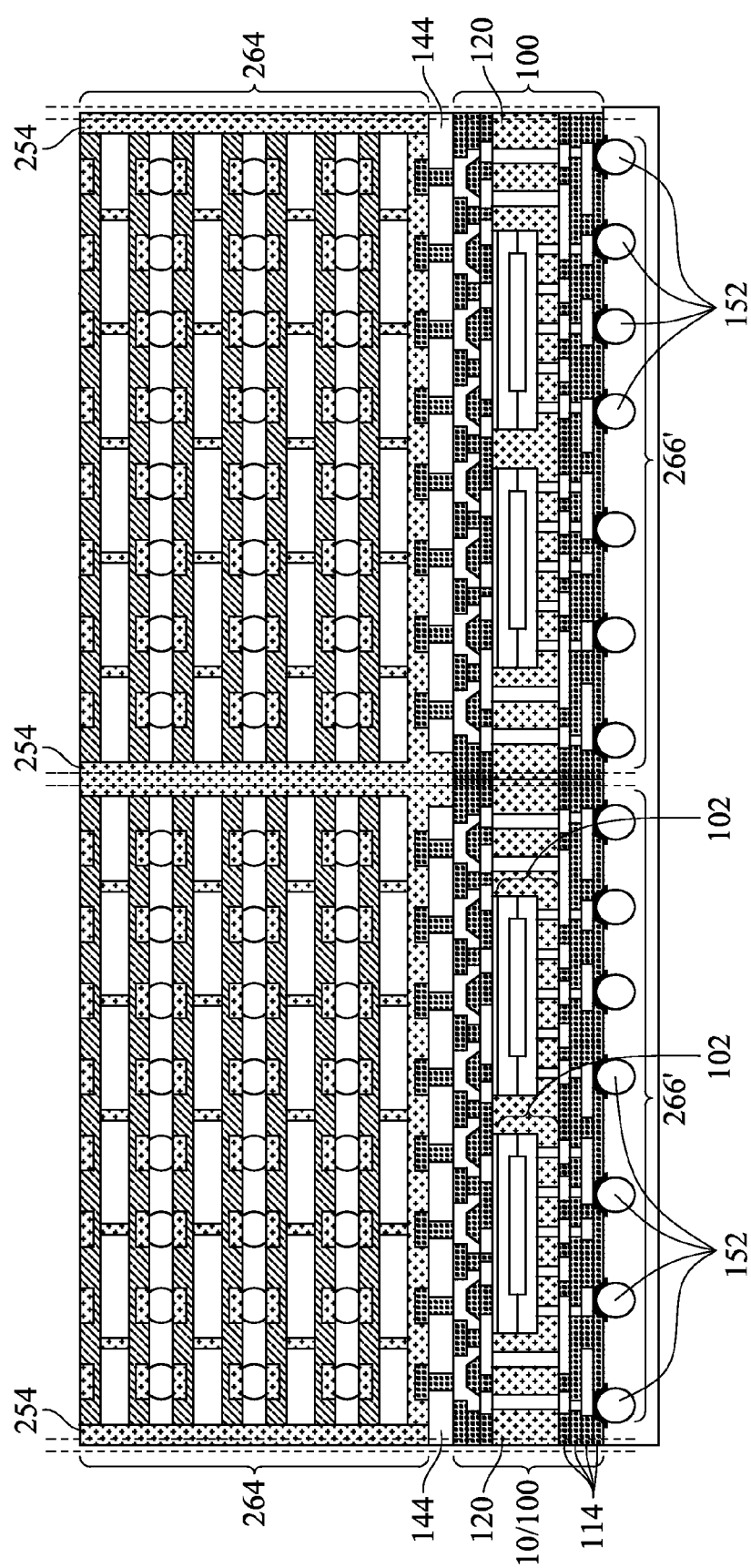

The structure shown in FIG. 16 is obtained from the composite wafer 150 shown in FIG. 4. FIG. 17 illustrates an embodiment wherein the composite wafer 150 is the one shown in FIG. 9. In the structure in FIG. 9, solder balls 152 are pre-formed in the respective composite wafer 150. Accordingly, solder balls 152 are also in packages 266' as in FIG. 17.

As shown in FIGS. 16 and 17, since package 266' is formed by sawing from composite wafers 150 and 250, which are bonded together, the sawing kerves pass through molding materials 120, 254, underfill (or polymer film) 144, and dielectric layers 114 and 118. Accordingly, in the resulting packages 266', molding material 254 has edges co-terminus with (aligned with) the edges of underfill 144, molding material 120, and dielectric layers 114 and 118. Furthermore, the sidewalls of dielectric layers 114 and 118 are not covered and are not in contact with any molding material such as molding compound, molding underfill, or the like.

Figure 18:
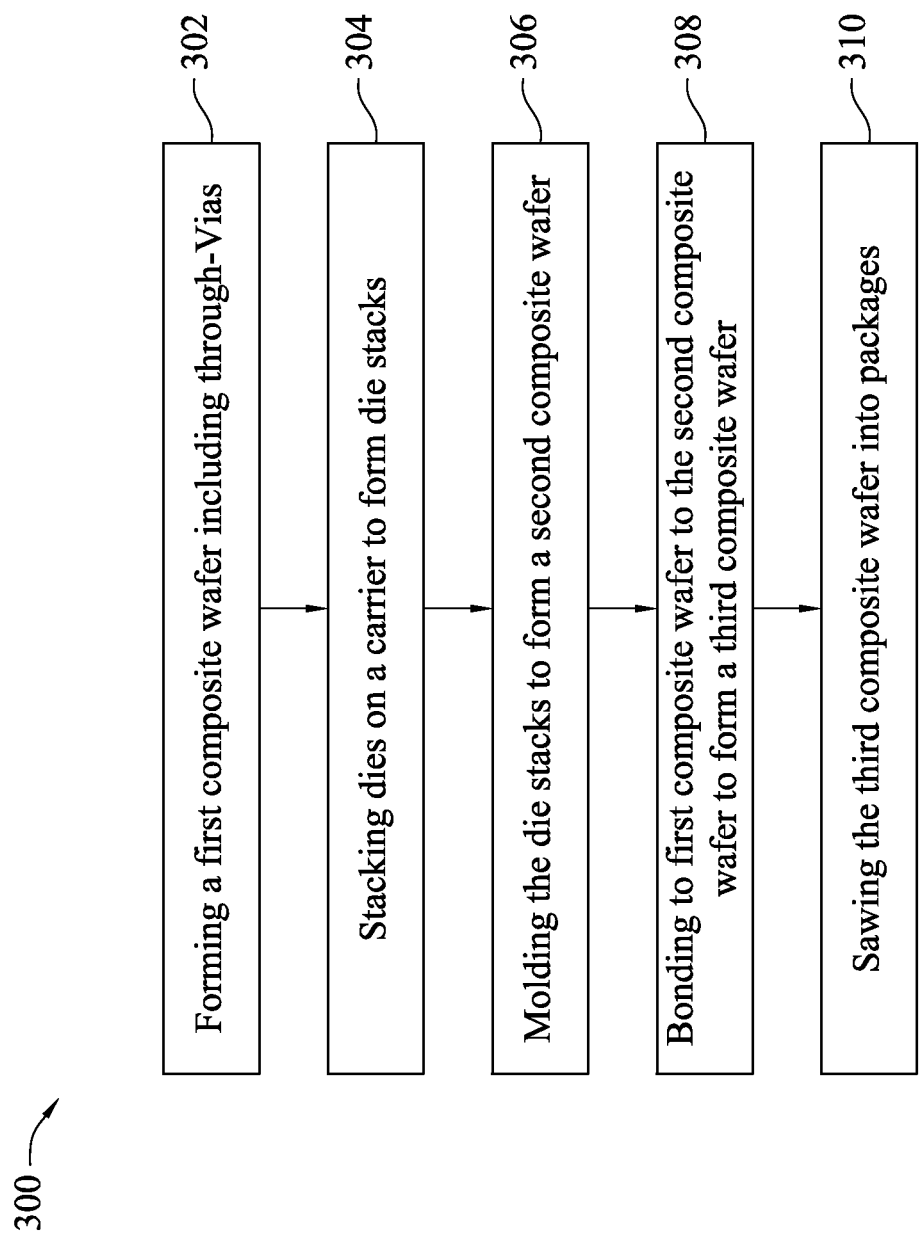
FIG. 18 illustrates a process flow in accordance with some embodiments.

FIG. 18 schematically illustrates the process flow 300 for the processes in FIGS. 1 through 17. The process flow is briefly discussed herein. The details of the process flow may be found in the discussion of FIGS. 1 through 17. In step 302, first composite wafer 150 (FIGS. 4 and 9) is formed, and the respective process steps are shown in FIGS. 1 through 9. In step 304 of the process flow in FIG. 18, die stacks 264 (FIG. 13) are formed, and the respective process steps are shown in FIGS. 10 through 13. In step 306 of the process flow in FIG. 18, die stacks 264 are molded in a molding material to form composite wafer 250, and the respective process step is also shown in FIG. 13. In step 308 of the process flow in FIG. 18, the first composite wafer 150 and the second composite wafer 250 are bonded together, and the respective process steps are shown in FIGS. 14A, 14B, and 15. In step 310 of the process flow in FIG. 18, composite wafer 266 (FIGS. 16 and 17) is sawed into packages.

The embodiments of the present disclosure have some advantageous features. In conventional die stacking structures, memory dies are bonded to underlying logic dies at die level. In the stacking process, the individual logic dies may shift when the overlying memory dies are bonded thereon. In the embodiments of the present disclosure, the memory dies are bonded to the logic dies in wafer form. Accordingly, the shifting in the logic dies is eliminated. In addition, the throughput of the packaging process is improved.

In accordance with some embodiments of the present disclosure, a method includes the formation of a first composite wafer, the steps which include molding a plurality of device dies and a plurality of through-vias in a first molding material as well as forming redistribution lines on opposite sides of the first molding material. The redistribution lines are inter-coupled through the plurality of through-vias. The method further includes the formation of a second composite wafer, including stacking a plurality of dies to form a plurality of die stacks and molding the plurality of die stacks in a second molding material. The second molding material fills gaps between the plurality of die stacks. The first composite wafer is bonded to the second composite wafer to form a third composite wafer.

In accordance with alternative embodiments of the present disclosure, a method includes the formation of a first composite wafer: forming a first plurality of redistribution lines, adhering backsides of a plurality of device dies to the first plurality of redistribution lines, forming a plurality of through-vias connected to the first plurality of redistribution lines, molding the plurality of device dies and the plurality of through-vias in a first molding material, and forming a second plurality of redistribution lines on an opposite side of the first molding material than the first plurality of redistribution lines. The method further includes the formation of a second composite wafer, including stacking a plurality of dies to form a plurality of die stacks over a carrier, and molding the plurality of die stacks in a second molding material. Electrical connectors at top surfaces of each of the plurality of die stacks are exposed out of the second molding material. The electrical connectors of the second composite wafer are bonded to the first composite wafer to form a third composite wafer.

In accordance with yet alternative embodiments of the present disclosure, a package includes a first package component and a second package component. The first package component includes a device die and a through-via in a first molding material as well as a first plurality of redistribution lines and a second plurality of redistribution lines on opposite sides of the first molding material. The first plurality of redistribution lines is electrically coupled to the second plurality of redistribution lines through the through-via. The second package component is bonded to the first package component. The second package component includes a die stack including a plurality of dies and a second molding material encircling the die stack. Edges of the first molding material are aligned to respective edges of the second molding material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

What is claimed is:

1. A method comprising:
    forming a first composite wafer comprising:
        forming a first plurality of redistribution lines;
        adhering backsides of a plurality of device dies to the first plurality of redistribution lines;
        forming a plurality of through-vias connected to the first plurality of redistribution lines;
        molding the plurality of device dies and the plurality of through-vias in a first molding material;
        forming a second plurality of redistribution lines on an opposite side of the first molding material than the first plurality of redistribution lines;
        pre-forming a patternable underfill;
        attaching the pre-formed patternable underfill to the first composite wafer, with the pre-formed patternable underfill contacting portions of the first plurality of redistribution lines; and
        patterning the pre-formed patternable underfill on the first composite wafer to form openings;
    forming a second composite wafer comprising:
        stacking a plurality of dies to form a plurality of die stacks over a carrier; and
        molding the plurality of die stacks in a second molding material, with electrical connectors at top surfaces of each of the plurality of die stacks exposed out of the second molding material; and
    inserting the electrical connectors of the second composite wafer into the openings to bond the second composite wafer to the first composite wafer to form a third composite wafer.

2. The method of claim 1, wherein during the molding the plurality of die stacks in the second molding material, the second molding material fills gaps between the plurality of die stacks.

3. The method of claim 1, wherein the first plurality of redistribution lines is formed starting from an additional carrier, and wherein the method further comprises:
    after the forming the second plurality of redistribution lines and before the bonding, performing a carrier swapping to remove the additional carrier.

4. The method of claim 1 further comprising sawing the third composite wafer as a plurality of packages, with each of the plurality of packages comprising one of the plurality of device dies and one of the plurality of die stacks.

5. The method of claim 1 wherein after the bonding, the patternable underfill is in contact with a surface dielectric layer of the second composite wafer.

6. The method of claim 1, wherein the stacking the plurality of dies to form the plurality of die stacks and the molding the plurality of die stacks comprise bonding the plurality of dies starting from a carrier, and wherein the method further comprises removing the carrier.

7. The method of claim 1, wherein the molding the plurality of die stacks in the second molding material comprises an expose molding.

8. A method comprising:
    forming a first plurality of dielectric layers over a first carrier having a rounded top-view shape;
    forming a first plurality of redistribution lines in the first plurality of dielectric layers, wherein the first plurality of redistribution lines and the first plurality of dielectric layers have a planar top surface, with the planar top surface comprising a top surface of a top layer in the first plurality of dielectric layers, and top surfaces of portions of the first plurality of redistribution lines;
    placing a first plurality of device dies, wherein each of the first plurality of device dies is adhered to the planar top surface through an adhesive film, with the adhesive film in contact with the planar top surface;
    encapsulating the first plurality of device dies in a first encapsulating material;
    forming a second plurality of dielectric layers over the first encapsulating material;
    forming a second plurality of redistribution lines in the second plurality of dielectric layers, wherein the first and the second plurality of redistribution lines are electrically coupled to the first plurality of device dies;
    applying and patterning a polymer layer, with portions of the first plurality of redistribution lines exposed through openings in the polymer layer;

placing a second plurality of device dies over a second carrier having a rounded top-view shape;

bonding a third plurality of device dies to the second plurality of device dies, with each of the third plurality of device dies being bonded to one of the second plurality of device dies;

encapsulating the second plurality of device dies and the third plurality of device dies in a second encapsulating material;

forming electrical connectors electrically coupled to the second plurality of device dies and the third plurality of device dies;

inserting the electrical connectors into the openings in the polymer layer; and bonding the electrical connectors to the portions of the first plurality of redistribution lines.

9. The method of claim 8, wherein the applying and patterning the polymer layer comprises:

pre-forming the polymer layer; and attaching the pre-formed polymer layer to the first plurality of redistribution lines; and patterning the pre-formed polymer layer to form the openings.

10. The method of claim 8, wherein one of the first carrier and the second carrier remains to be attached to respective ones of the first plurality of device dies and second plurality of device dies when the bonding is performed.

11. The method of claim 8, wherein the bonding comprises a metal-to-metal bonding.

12. The method of claim 8 further comprising, after the bonding, sawing through the first encapsulating material and the second encapsulating material to form a plurality of discrete packages, with each of the plurality of discrete packages comprising one of the first plurality of device dies, one of the second plurality of device dies, and one of the third plurality of device dies.

13. The method of claim 8, wherein the electrical connectors are metal pillars, and at a time after the inserting and before the bonding, one of the metal pillars has opposite sidewalls contacting sidewalls of the polymer layer.

14. A method comprising:

forming a first composite wafer comprising:

forming a first plurality of redistribution lines;

adhering backsides of a plurality of device dies to the first plurality of redistribution lines;

forming a plurality of through-vias connected to the first plurality of redistribution lines;

molding the plurality of device dies and the plurality of through-vias in a first molding material;

forming a second plurality of redistribution lines on an opposite side of the first molding material than the first plurality of redistribution lines;

pre-forming a patternable underfill;

attaching the pre-formed patternable underfill to the first composite wafer, with the pre-formed patternable underfill contacting portions of the first plurality of redistribution lines; and patterning the pre-formed patternable underfill on the first composite wafer to form openings;

forming a second composite wafer comprising:

stacking a plurality of dies to form a plurality of die stacks over a carrier; and molding the plurality of die stacks in a second molding material, with electrical connectors at top surfaces of each of the plurality of die stacks exposed out of the second molding material; and inserting the electrical connectors of the second composite wafer into the openings to bond the second composite wafer to the first composite wafer to form a third composite wafer, wherein in a cross-sectional view of the first composite wafer and the second composite wafer, the electrical connectors fully fill the openings.

15. The method of claim 14, wherein during the molding the plurality of die stacks in the second molding material, the second molding material fills gaps between the plurality of die stacks.

16. The method of claim 14, wherein the first plurality of redistribution lines is formed starting from an additional carrier, and wherein the method further comprises:

after the forming the second plurality of redistribution lines and before the bonding, performing a carrier swapping to remove the additional carrier.

17. The method of claim 14 further comprising sawing the third composite wafer as a plurality of packages, with each of the plurality of packages comprising one of the plurality of device dies and one of the plurality of die stacks.

18. The method of claim 14, wherein after the bonding, the patternable underfill is in contact with a surface dielectric layer of the second composite wafer.

19. The method of claim 14, wherein the stacking the plurality of dies to form the plurality of die stacks and the molding the plurality of die stacks comprise bonding the plurality of dies starting from a carrier, and wherein the method further comprises removing the carrier.

* * * * *